Oct. 18, 1966 H. S. SOMMERS, JR 3,280,339

BIAS CIRCUITS FOR HIGH FREQUENCY CIRCUITS UTILIZING VOLTAGE CONTROLLED NEGATIVE RESISTANCE DEVICES

Filed May 9, 1962

INVENTOR.
HENRY S. SOMMERS, JR.
BY Eugene M. Whitacre
ATTORNEY

United States Patent Office 3,280,339
Patented Oct. 18, 1966

3,280,339

BIAS CIRCUITS FOR HIGH FREQUENCY CIRCUITS UTILIZING VOLTAGE CONTROLLED NEGATIVE RESISTANCE DEVICES

Henry S. Sommers, Jr., Princeton, N.J., assignor to Radio Corporation of America, a corporation of Delaware Filed May 9, 1962, Ser. No. 193,479
9 Claims. (Cl. 307—88.5)

This invention relates to electrical circuits for voltage controlled negative resistance devices, and more particularly to biasing circuits for high frequency power oscillators and power amplifiers utilizing voltage controlled negative resistance devices such as tunnel diodes.

It has heretofore been proposed that the biasing circuit for a voltage controlled negative resistance device, such as a tunnel diode, include a stabilizing resistor direct current conductively connected across the diode. It has also been proposed that the stabilizing resistor should have a direct current resistance value which is less than the absolute value of the negative resistance of the device at its operating point to permit biasing of the device to exhibit a stable negative resistance, and to stabilize the biasing circuit for the device against spurious oscillation.

The requirements of the stabilizing resistor are contradictory between the power losses in the circuit on the one hand and stabilization on the other hand. Since the stabilizing resistor is in parallel with the diode, direct current (D.-C.) power and alternating current (A.-C.) power will be dissipated and, therefore, the stabilizing resistor should be as large as possible to minimize power losses. However as noted above, to maintain stability of the circuit in which the negative resistance device is connected, the stabilizing resistor should be as small as possible.

Accordingly, it is an object of this invention to provide an improved biasing circuit for negative resistance devices.

A further object of this invention is to provide an improved biasing circuit for negative resistance devices which includes stabilizing resistance means for biasing the negative resistance device to operate in the negative resistance portion of its current-voltage characteristic, and for providing significant reduction in the amount of D.-C. power which is dissipated by the stabilizing resistance means as compared to known types of biasing circuits.

Another object of the invention is to provide an improved biasing circuit for a tunnel diode oscillator in which the amount of A.-C. and D.-C. power dissipated by the stabilizing resistor means is substantially reduced as compared to known types of resistance-stabilized circuits.

In accordance with the invention the biasing circuit for a negative resistance device, such as a tunnel diode, includes a nonlinear stabilizing resistor direct current conductively connected across the negative resistance device. The nonlinear stabilizing resistor, which may comprise a forward biased heavily doped junction diode, such as a tunnel rectifier, in which tunneling is the chief conduction mechanism, has a dynamic resistance for voltages at the desired operating point in the negative resistance region of the device which is lower than the absolute value of the negative resistance exhibited by the device at the operating point. However, for a range of lower voltages, the dynamic resistance of the nonlinear stabilizing resistor is significantly increased. A biasing circuit including a nonlinear resistor of the type described permits biasing of the negative resistance device to a stable operating point in the negative resistance region. At the operating point, the dynamic or A.-C. resistance of the nonlinear resistor is low enough to stabilize the biasing circuit against parasitic oscillation, but its ratio of D.-C. voltage to D.-C. current at the operating point is much larger than that of a linear resistor as used in prior types of biasing circuits, thereby reducing the dissipation of D.-C. power.

In addition to the reduction of static or D.-C. losses, the dynamic losses of the circuit may be reduced. For oscillator or signal voltage swings in one direction, the load line of the nonlinear resistor can substantially coincide with the load line of circuits using a linear stabilizing resistor so that the losses of the two circuits are substantially the same. However when the voltage swing is in the other direction, the resistance of the nonlinear resistor is much higher than that of a linear stabilizing resistor thereby reducing the A.-C. losses in circuits embodying the invention.

The novel features which are considered to be characteristic of this invention are set forth with particularity in the appended claims. The invention itself, however, both as to its organization and method of operation as well as additional objects and advantages thereof, will best be understood from the following description when read in connection with the accompanying drawings, in which:

Figures 1, 2, 3, 4, 5, 6:
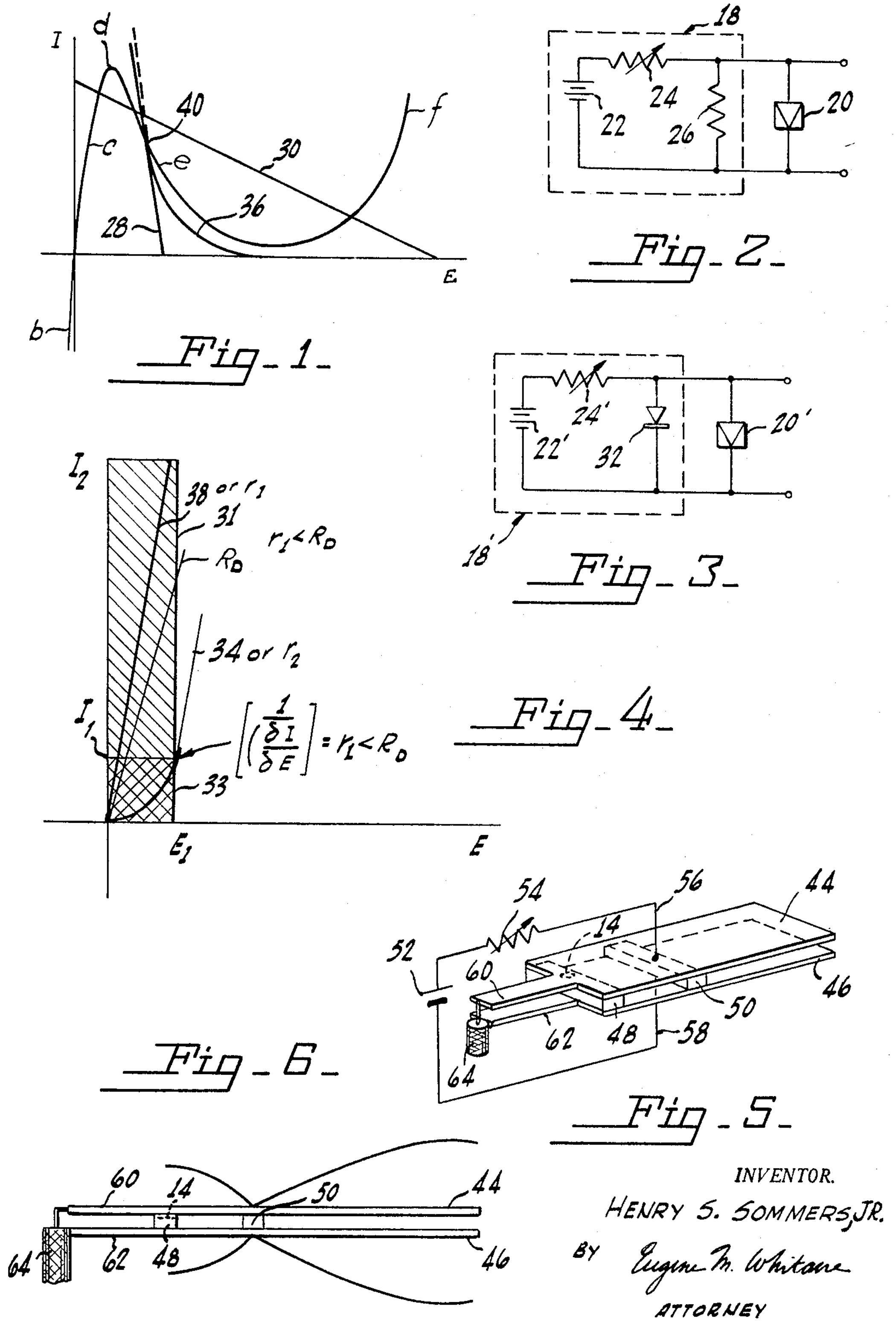
FIGURE 1 is a graph illustrating the voltage-current characteristic of a voltage controlled negative resistance device such as a tunnel diode.
FIGURE 2 is a schematic circuit diagram of a D.-C. biasing circuit for a voltage controlled negative resistance diode, of a type heretofore proposed.
FIGURE 3 is a schematic circuit diagram of a D.-C. biasing circuit for a negative resistance diode, such as a tunnel diode, embodying the invention.

FIGURE 4 is a graph illustrating the voltage current characteristics of the absolute value of the static resistance of a tunnel diode at an operating voltage in its negative resistance region, a linear stabilizing resistor of the type shown in FIGURE 2, and a nonlinear stabilizing resistor of the type shown in FIGURE 3, illustrating the relative D.-C. power losses in the stabilizing resistors used in the circuits of FIGURE 2 and FIGURE 3;

FIGURE 5 is a perspective view of a form of transmission line oscillator circuit embodying the invention; and, FIGURE 6 is a graph illustrating the standing wave characteristics along the transmission line portion of the oscillator circuit shown in FIGURE 5.

As mentioned above, circuits embodying the invention include voltage controlled negative resistance devices such as tunnel diodes. Tunnel diodes have a current-voltage characteristic of the type shown in FIGURE 1. The current scales depend on the area and doping of the junction, and representative currents range from the milliampere range to many amperes for power diodes.

For a small voltage in the back or reverse direction, the back current of the diode increases as a function of voltage as is indicated by the region *b* of FIGURE 1.

For small forward bias voltages, the characteristic is symmetrical (FIGURE 1, region *c*). The forward current results from quantum mechanical tunneling. At higher forward bias voltages, the forward current due to tunneling reaches a maximum (region *d*, FIGURE 1), and then begins to decrease. This drop continues (FIGURE 1, region *e*) until eventually other processes including normal injection over the barrier become important and the characteristic turns into the usual forward behavior (region *f*, FIGURE 1).

As shown in FIGURE 2, a known type of biasing circuit for a tunnel diode 20 may comprise a suitable voltage source such as a battery 22, a variable resistor 24 and a resistor 26, the latter being connected in parallel with the diode 20. To bias the diode for stable operation in the negative resistance region of its current-voltage characteristic, the impedance presented across the diode by the biasing circuit must be less than the absolute value of the negative resistance of the diode at the operating point. To this end, and to stabilize the bias circuit against parasitic oscillation, the resistor 26 is usually selected to have a resistance which is less than the absolute value of the minimum negative resistance of the tunnel diode.

The biasing circuit 18 for the tunnel diode 20 has a D.-C. load line 28 as indicated in FIGURE 1, which is characterized by a current-voltage relationship which has a greater slope than the negative slope of the diode characteristic and intersects the diode characteristic at only a single point. If the biasing circuit 18 has an internal resistance which is greater than the negative resistance of the diode, the biasing circuit would have a load line 30 with a smaller slope than the negative slope of the diode characteristic as indicated in FIGURE 2, and would intersect the diode characteristic curve at three points. Under the latter conditions the diode is not stably biased in the negative resistance region. This is because an incremental change in current through the diode due to transient or noise currents or the like produces a regenerative reaction which causes the diode to assume one of its two stable states represented by the intersection of the load line 30 with the positive resistance portions of the diode characteristic curve.

In accordance with the invention, a nonlinear resistor 32 is used as the stabilizing resistor in the biasing circuit 18' as is shown in FIGURE 3. The biasing circuit including the nonlinear resistor 32 has a current-voltage characteristic 34 (measured across the nonlinear resistor 32) as shown in FIGURE 4 The D.-C. load line for the composite biasing circuit of FIGURE 3 is shown by the curve 36 of FIGURE 1. The load line 36 for the biasing circuit of FIGURE 3 provides a stable angle of intersection with the current-voltage characteristic of the tunnel diode 20' thereby providing stable operation in the negative resistance region of the diode operating characteristic. The variable resistor 24' includes the internal resistance of the D.-C. source represented by the battery 22' and is of sufficiently high resistance to prevent substantial swamping of the curvature of the nonlinear resistor 32 current-voltage characteristic.

One form of nonlinear resistor which may be used in circuits embodying the invention comprises a tunnel rectifier operating in its forward or easy conducting direction. This is a highly suitable nonlinear resistor because of its large curvature for voltages corresponding to operation in the negative resistance region of tunnel diodes. Such a diode can be tailored to fit a given circuit application. The point along the voltage axis (of FIGURE 4) at which the curve 34 starts rising rapidly can be controlled by the amount of doping and the junction area. As the amount of doping is decreased or the junction area is decreased the point at which the curve 34 reaches the desired slope moves to the right as viewed in FIGURE 4, and thus occurs at a greater forward bias voltage. A diode of this type when used as the stabilizing resistor has the advantage that the current voltage characteristic thereof has a low temperature coefficient and a fast response.

A sufficient condition for stabilizing the biasing circuit is (1) a noninductive stabilizing resistor 32 chosen so that its resistance $r_2$ is less than $R_d$, where $r_2$ is the dynamic resistance of the resistor 32 at the operating voltage and $R_d$ is the absolute value of the minimum negative resistance of the diode 20', and (2)

$$r_2C_2<R_dC_d$$

where $C_2$ is the shunt capacitance of the nonlinear resistor (in this case the junction capacitance of the tunnel rectifier) and $C_d$ is the junction capacitance of the tunnel diode. This relation will be satisfied if the tunnel rectifier is made of the same material with the same doping level, and using the same heating cycle as the tunnel diode since the diode used as a tunnel rectifier always has a smaller resistance-capacitance product than when used as a tunnel diode. The dynamic resistance of the tunnel rectifier can be adjusted to its appropriate value of somewhat less than $R_d$ by reducing the junction area by etching in ways known in tunnel diode technology. A package that is suitable for the tunnel diode will also have electrical properties suitable for the tunnel rectifier.

The tunnel rectifier 32 of FIGURE 3 will not load the output circuit provided it is connected at a point in the circuit where the voltage swing in the operating circuit is small. Other types of nonlinear resistances can be used if they satisfy the condition imposed by the circuit stability requirements that, (*a*)

$$r_2<R_d$$

at voltages corresponding to an operating point in the negative resistance region of the diode characteristic, and (*b*) negligible reactive effect at all frequencies up to the tunnel diode cutoff frequency. Condition (*b*) can be readily satisfied if the actual value of the resistance does not change with frequency, if the mounting is substantially noninductive, and if the effect of the shunt capacitance $C_2$ of the nonlinear resistor satisfies the relation $r_2C_2<R_dC_d$, noted above. Among other types of nonlinear resistors which satisfy these conditions are Zener diodes, reversed biased tunneling junctions, or forward biased p–n junctions as long as the injected minority carriers do not limit the frequency of the A.-C. circuit and the capacitance condition is satisfied.

As shown in FIGURE 4 the power losses of a circuit embodying the invention are less than the losses in circuits using linear stabilizing resistors. The biasing circuit including the linear resistor 26 of FIGURE 2 dissipates a considerable amount of D.-C. power $E_1I_2$ watts, at the operating point of the diode 20 as is indicated by the cross hatched rectangle 31 of FIGURE 4. The biasing circuit including the nonlinear resistor of FIGURE 3 dissipates much less D.-C. power $E_1I_1$ watts, as is indicated by the smaller double crosshatched rectangle 33 of FIGURE 4. It was found that the use of a nonlinear stabilizing resistor with germanium tunnel diodes reduces the D.-C. power loss by a factor of 3.5 as compared to circuits using linear stabilizing resistors. With gallium arsenide tunnel diodes, the D.-C. power loss was reduced by a factor of 6.2.

In addition to the reduction of D.-C. power dissipation in circuits embodying the invention, the dynamic, or A.-C. power dissipation is also reduced. For oscillator or signal voltage swings in the positive direction, it will be seen from FIGURE 4 that the curves for the linear and nonlinear resistors as represented by the curves 38 and 34 respectively are substantially parallel, or of the same resistance, and accordingly the A.-C. dissipation for both circuits is substantially the same. However when the voltage swing is negative approaching the origin, or overshooting it, the resistance of the nonlinear resistor 32 is very high as compared to that of a linear stabilizing resistor so that there is substantially less A.-C. loss across the shunt nonlinear stabilizing resistor 32 of FIGURE 3 than the linear stabilizing resistor 26 of FIGURE 2.

The line $R_D$ of FIGURE 4 is a reference line drawn with a positive slope corresponding to the negative resistance of the tunnel diode at its operating point. The stability condition on biasing circuit 18 is satisfied when the effective resistance of the resistor 26, in shunt with the diode 20 is less than $R_D$ which, as shown, is represented by the steeper line 38 or $r_1$. The stability condition for the biasing circuit 18' including the nonlinear resistor 32 is also satisfied since the dynamic resistance at the operating point of the resistor 32 is less than $R_D$ as shown by the portion of the curve 34 at the operating voltage $E_1$ which is steeper than the line $R_D$.

The nonlinear stabilizing resistor 32 has a dynamic resistance which is smaller than that of the negative resistance of the tunnel diode at voltages corresponding to operating point 40. Thus the parallel negative resistance of the diode 20′ and the nonlinear stabilizing resistor 32 presents a net positive resistance to the biasing circuit thereby reducing the susceptibility of the biasing circuit to parasitic or spurious oscillation.

In order that the diode 20′ may effectively act as an active circuit element in an A.-C. circuit, the diode must present a negative resistance to the circuit in which it comprises the active device. One manner in which this may be accomplished is illustrated in FIGURE 5, which shows a resonant transmission line oscillator. The oscillator comprises a pair of parallel transmission line conductors 44 and 46. The transmission line may comprise electrically conductive sheets or ribbons having opposed major surfaces which may be separated by suitable insulation means, not shown. The particular dimensions of the conductors 44 and 46 are selected to provide the desired frequency of resonance in the system at a predetermined characteristic impedance.

A voltage controlled negative resistance diode 48 is mounted between the conductors 44 and 46 at one end thereof, by any convenient method which provides good ohmic contact between the diode and the conductor. A nonlinear resistor 50 which may comprise a tunnel rectifier as described above, is connected between the conductors 44 and 46 at a point close enough to the diode 48 so that the intervening inductive reactance is unimportant compared to the dynamic resistance of tunnel rectifier 50 at all frequencies at which parasitic oscillations might occur. The nonlinear resistor 50 is connected to the conductors 44 and 46 at a point where the standing wave voltage for the desired mode of oscillation is a minimum, and therefore, the resistor 50 does not appreciably damp oscillations in the circuit. The D.-C. bias for the diode 48 is provided by a current source which includes a battery 52 and a variable resistor 54 of suitable resistance. Connections from the current source including the conductors 56 and 58 are connected to the transmission line conductors 44 and 46 respectively at points thereon adjacent the resistor 50. The variable resistor 54 is adjusted to provide the necessary current to bias the diode 48 at the desired point in the negative resistance region of its characteristic. If further isolation is desired between the bias circuit and the operating (A.-C.) circuit, suitable filters, not shown may be connected between the bias circuit and the points of connections to the transmission line of the conductors 56 and 58 without impairing the oscillator performance.

Oscillatory energy is derived from the transmission line by means of an impedance matching device comprising the parallel conductors 60 and 62 which form extensions of the transmission line conductors 44 and 46. The dimensions of the conductors 60 and 62 are selected to provide the desired impedance transformation between the resonant transmission line and a suitable load which may comprise circuits, not shown, which are connected to a coaxial cable 64.

The standing wave pattern along the resonant transmission line and the impedance matching device is shown in FIGURE 6. Since the transmission line is operating in the quarter wave mode, a voltage maximum exists near the free end thereof and decreases to a minimum at a point where the nonlinear resistor 50 is connected. Thereafter the voltage increases toward the opposite end of the line. This configuration has the advantage of giving a voltage step-up from the diode 48 to the open end of the line thus permitting the low impedance diode to be matched to a standard impedance line.

For operation, the negative resistance diode is biased at an operating point in the negative resistance region of its characteristic curve, by adjusting the variable resistor 54. Since the absolute value of the negative resistance of the diode 48 is larger than the positive resistance of the resistor 50 the voltages corresponding to operating points in the negative resistance region of the diode operating characteristic, the combination appears as a net positive resistance to the D.-C. circuit, so that parasitic oscillations will not occur in the D.-C. circuit. Furthermore, undesired modes of oscillation of the transmission line are suppressed because of the damping action of the resistor 50.

To oscillate, the A.-C. resonant circuit must have a multi-valued intersection of the load line with the diode voltage-current characteristic similar to the load line 30 shown in FIGURE 1. This load line will exist at any frequency where Q of the resonant circuit exceeds the effective Q of the diode. The effective Q of the diode may be defined by the formula $1/\omega RC$ wherein R corresponds to the negative resistance of the diode and C corresponds to the capacity across the diode.

Since the nonlinear resistor 50 is at a voltage minimum point along the transmission line conductors 44 and 46, which corresponds to a low impedance point at resonance, this resistor has little effect on the transmission line operation, and the diode circuit present a combined negative resistance at the position of diode 48 to the transmission line conductors 44 and 46 to produce oscillation. The resultant oscillatory energy is coupled through the impedance matching device including the conductors 60 and 62 to the load. The transmission line can be tuned over a range of frequencies by changing the D.-C. operating point of the diode or by changing the physical length of the conductors 44 and 46. For very large frequency changes the position of the resistor 50 may have to be changed. Alternatively, tuning of the oscillator may be effected by terminating the open end of the transmission line with a variable capacitance means.

The use of a nonlinear resistor in an oscillator circuit of the type described significantly reduces the static or D.-C. power consumption of the oscillator as compared to similar circuits using a linear stabilizing resistor. In addition the use of a nonlinear stabilizing resistor also reduces the dynamic or A.-C. power dissipation.

What is claimed is:

1. An electrical circuit including a voltage controlled negative resistance device, biasing circuit means for said device including a nonlinear resistance element direct current conductively connected in parallel with said device having a dynamic resistance which is lower than the absolute value of the negative resistance of said device at the operating voltage of said device to bias said device for stable operation in the negative resistance portion of its operating characteristic.

2. An electrical circut including a voltage controlled negative resistance device adapted to be biased to an operating voltage to exhibit a negative resistance, biasing circuit means for said device including a nonlinear resistive element direct current conductively connected in parallel with said device to bias said device for stable operation at said operating voltage in the negative resistance portion of its operating characteristic, said nonlinear resistive element characterized by a dynamic resistance which is lower than the absolute value of the negative resistance of said device at the operating voltage of said device and a relatively larger dynamic resistance for a range of voltages less than said operating voltage.

3. An electrical circuit including a voltage controlled negative resistance device adapted to be forward biased to an operating voltage to exhibit a negative resistance, a tunneling diode connected in parallel with said voltage controlled negative resistance device so that a forward bias applied to said voltage controlled negative resistance device biases said tunneling diode into the tunnel rectifying mode, and means for applying a voltage across said tunneling diode to forward bias said negative resistance device for stable operation in the negative resistance portion of its operating characteristic.

4. In combination:

a tunnel diode having a current-voltage characteristic including two regions of positive resistance separated by a negative resistance region;
alternating current circuit means having a pair of substantially A.-C. equipotential terminals;
means connecting said diode to said alternating current circuit means as an active circuit element, said equal A.-C. potential terminals being direct current conductively connected to said diode;
a tunnel rectifier characterized by a dynamic impedance which is lower than the absolute value of the minimum negative resistance of said diode for the operating voltage at which said minimum negative resistance occurs and a relatively larger dynamic resistance for a range of voltages less than said operating voltage;
means connecting said tunnel rectifier to said alternating current circuit means between said pair of substantially equal potential terminals; and
bias current circuit means connected to bias said diode to exhibit a negative resistance.

5. In combination:
a negative resistance diode having a current-voltage characteristic including a first positive resistance region for a first range of forward bias voltages, a negative resistance region for a second range of forward bias voltages and a second positive resistance region for a third range of forward bias voltages, and having an inherent junction capacitance,
means providing a direct current circuit connected for biasing said diode to an operating voltage to exhibit a negative resistance characteristic;
alternating current circuit means comprising a resonant transmission line including a pair of conductors;
a tunnel rectifier having inherent junction capacitance characterized by a dynamic resistance which is lower than the absolute value of the negative resistance of said diode at the operating voltage of said diode and which increases for a range of voltages less than said operating voltage, said junction capacitance of said tunnel rectifier being of such a value that the product of the junction capacitance of the tunnel rectifier times the resistance exhibited by the tunnel rectifier at the operating voltage is less than the product of said junction capacitance of said negative resistance diode times the absolute value of minimum resistance of said diode, said tunnel rectifier connected between the conductors of said transmission line at a voltage node;
means connecting said diode between the conductors of said transmission line at a position spaced from said voltage node; and
means connecting said direct current circuit between the conductors of said transmission line.

6. An electrical circuit including:
a voltage controlled negative resistance device adapted to be biased to an operating voltage to exhibit a negative resistance;
biasing circuit means for said device including a current source and a tunnel rectifier;
means direct current conductively connecting said tunnel rectifier in parallel with said device;
said biasing circuit means having a current-voltage characteristic as measured across said tunnel rectifier which provides a D.-C. load line that intersects the current voltage characteristic of said device at substantially the desired operating voltage in the negative resistance region of said device;
the dynamic resistance of said nonlinear resistor being less than the absolute value of the dynamic resistance of said device at said operating voltage, and the junction capacitance $C_2$ of said tunnel rectifier being such that a condition for stably biasing said negative resistance device in said negative resistance region $r_2C_2<R_dC_d$, where $r_2$ is the value of resistance exhibited by said tunnel rectifier, $R_d$ is the absolute value of minimum negative resistance of said negative resistance device, and $C_d$ is the junction capacitance of said negative resistance device, is satisfied.

7. In combination:
a tunnel diode;
alternating current circuit means having a pair of substantially alternating current equipotential terminals;
means connecting said diode to said alternating current circuit means as an active circuit element, said equal potential points being direct current conductively connected to said diode;
a nonlinear resistor element characterized by a dynamic impedance which is lower than the absolute value of the minimum negative resistance of said diode for the operating voltage at which said minimum negative resistance occurs and a relatively larger dynamic resistance for a range of voltages less than said operating voltages;
means connecting nonlinear resistor to said alternating current circuit means between said pair of substantially equal potential points, bias current circuit means connected to bias said diode to exhibit a negative resistance, and output circuit means coupled to said alternating current circuit means.

8. An electrical circuit comprising:
a voltage controlled negative resistance device;
biasing circuit means for said device including a current source and a nonlinear stabilizing resistive element conected in series;
means direct current conductively connecting said nonlinear resistive element to said device;
and output circuit means coupled to said device;
said nonlinear resistor providing a voltage source having a dynamic impedance which is lower than that of the circuits with which the nonlinear resistor is connected, and providing a predetermined voltage thereacross which has a static direct current resistance which is substantially larger than that of a linear resistor exhibiting the same dynamic resistance as the nonlinear resistor at said predetermined voltage, thereby effecting a reduction in the direct current power consumption as compared to a circuit using a linear resistor in the place of said nonlinear resistor.

9. An electrical circuit as defined in claim 8 wherein said nonlinear resistor comprises a tunnel rectifier.

References Cited by the Examiner

UNITED STATES PATENTS

| | | | |
|---|---|---|---|
| 2,487,279 | 11/1949 | Stalhane | 331—132 X |
| 2,796,505 | 6/1957 | Bocciarelli | 338—20 |
| 3,099,804 | 7/1963 | Nelson | 307—88.5 |

OTHER REFERENCES

Proceedings of The IRE, "Tunnel Diodes as High-Frequency Devices," by H. S. Sommers, Jr., July 1959, pp. 1201–1206.

ARTHUR GAUSS, *Primary Examiner.*

M. LEE, J. BUSCH, *Assistant Examiners.*